United States Patent
Harazono et al.

(10) Patent No.: US 9,913,372 B2
(45) Date of Patent: Mar. 6, 2018

(54) WIRING BOARD

(71) Applicant: KYOCERA Corporation, Kyoto-shi, Kyoto (JP)

(72) Inventors: Masaaki Harazono, Kirishima (JP); Takayuki Umemoto, Omihachiman (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 15/414,167

(22) Filed: Jan. 24, 2017

(65) Prior Publication Data

US 2017/0215277 A1   Jul. 27, 2017

(30) Foreign Application Priority Data

Jan. 25, 2016 (JP) ................. 2016-011322

(51) Int. Cl.
*H05K 1/03* (2006.01)
*H05K 3/46* (2006.01)

(52) U.S. Cl.
CPC ......... *H05K 1/0306* (2013.01); *H05K 3/4673* (2013.01); *H05K 1/0373* (2013.01); *H05K 2201/0191* (2013.01); *H05K 2201/0769* (2013.01)

(58) Field of Classification Search
CPC .......... H05K 3/46; H05K 1/0306; H05K 1/11; H05K 3/00; H01L 23/12
USPC ...................................................... 174/251
See application file for complete search history.

(56) References Cited

U.S. PATENT DOCUMENTS

| | | | | |
|---|---|---|---|---|
| 3,799,802 A | * | 3/1974 | Schneble | H01B 1/00 174/259 |
| 5,309,632 A | * | 5/1994 | Takahashi | H05K 3/181 174/266 |
| 5,856,068 A | * | 1/1999 | Magera | H05K 3/184 430/312 |
| 9,631,279 B2 | * | 4/2017 | Bahl | C23C 18/38 |
| 2011/0314666 A1 | * | 12/2011 | Harazono | H05K 3/4644 29/832 |
| 2015/0334825 A1 | * | 11/2015 | Bahl | C23C 18/38 174/251 |
| 2015/0334836 A1 | * | 11/2015 | Karavakis | H05K 3/426 174/257 |
| 2016/0234948 A1 | * | 8/2016 | Schumacher | H05K 1/0353 |

FOREIGN PATENT DOCUMENTS

JP   2004-207338 A   7/2004
JP   2004207338   *   7/2004

* cited by examiner

*Primary Examiner* — Timothy Thompson
*Assistant Examiner* — Michael F McAllister
(74) *Attorney, Agent, or Firm* — Volpe and Koenig, P.C.

(57) ABSTRACT

The wiring board of the present disclosure includes an insulating layer, and a wiring conductor existing so as to be adjacent to both main surfaces of the insulating layer; the insulating layer includes at least two particle-containing resin layers containing insulating particles in an insulating resin, and a particle-free resin layer formed of an insulating resin; and the particle-free resin layer is interposed between the particle-containing resin layers.

4 Claims, 1 Drawing Sheet

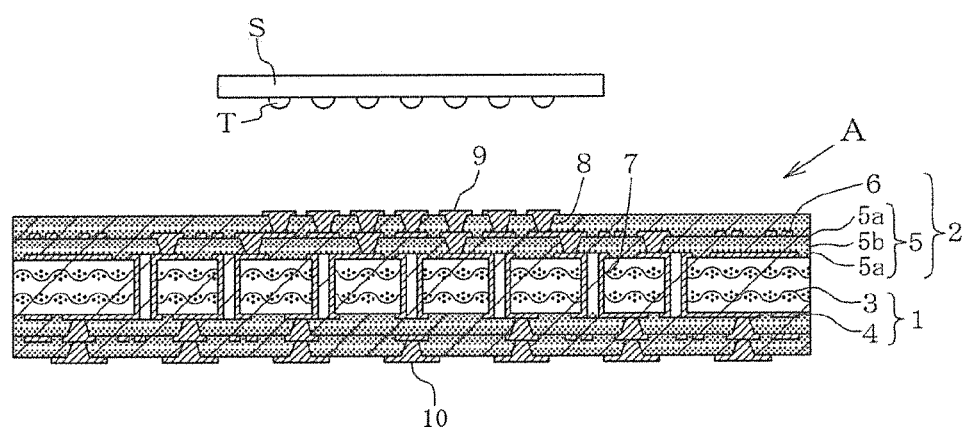

WIRING BOARD

BACKGROUND OF THE INVENTION

1. Technical Field

The present disclosure relates to a wiring board having high-density fine wiring.

2. Background

In recent years, as electronic devices typified by portable communication devices and music players have become more miniaturized and highly functionalized, electrodes of semiconductor elements used in these electronic devices are formed with small diameter and high density. Correspondingly, smaller diameter and higher density are in progress also in semiconductor-element connection pads of wiring boards. For this reason, when the semiconductor element is connected to the wiring board, it is important to connect the electrode and the semiconductor-element connection pad corresponding to each other accurately and reliably by reduction in the thermal expansion and contraction difference between the two. In order to reduce such a thermal expansion and contraction difference, dispersing insulating particles in build-up insulation layers at high density to reduce the coefficient of thermal expansion of the wiring board may reduce the difference in the coefficients of thermal expansion of the wiring board and the semiconductor element. Such a wiring board is described, for example, in Japanese Unexamined Patent Application Publication No. 2004-207338.

SUMMARY

The wiring board of the present disclosure includes an insulating layer, and a wiring conductor existing so as to be adjacent to both main surfaces of the insulating layer; the insulating layer includes at least two particle-containing resin layers containing insulating particles in an insulating resin, and a particle-free resin layer formed of an insulating resin; and the particle-free resin layer is interposed between the particle-containing resin layers.

BRIEF DESCRIPTION OF THE DRAWINGS

FIG. 1 is a schematic cross-sectional view showing an embodiment of a wiring board according to the present disclosure.

DETAILED DESCRIPTION

In a wiring board including insulating layers containing insulating particles at a high density, in the insulating layer, an interface between the insulating resin and the insulating particles may be continuously connected from the upper surface to the lower surface of the insulating layer. Since such the interface is physically and chemically fragile, metal ions are likely to move at the interface. As a result, the electrical insulation reliability between the wiring conductors existing in such a manner as to be adjacent to the upper surface and the lower surface of the insulating layer may decrease.

In the wiring board of the present disclosure, as described above, in the insulating layer both main surfaces of which the wiring conductors exist so as to be adjacent to, a particle-free resin layer is interposed between particle-containing resin layers. This allows the continuity of the interface between the insulating resin and the insulating particles in the particle-containing resin layers to be divided by the particle-free resin layer. Therefore, metal ions can be effectively prevented from moving from the upper surface to the lower surface of the insulating layer. As a result, a wiring board including fine high-density wiring lines excellent in insulation reliability can be provided.

Next, a wiring board according to an embodiment will be described with reference to FIG. 1. The wiring board A shown in FIG. 1 includes build-up portions 2 laminated on the upper and lower surfaces of a core board 1. The core board 1 is formed of an insulation plate 3 for the core and a wiring conductor 4 for the core. The build-up portion 2 is formed of an insulating layer 5 for the build-up and a wiring conductor 6 for the build-up.

The insulating plate 3 for the core has a plurality of through holes 7 penetrating from the upper surface of the insulating plate 3 to the lower surface of the insulating plate 3. The wiring conductor 4 for the core is deposited on the upper and lower surfaces of the insulating plate 3 and on the wall surface of the through holes 7. The wiring conductor 4 deposited in the through-hole 7 electrically connects the wiring conductors 4 on the upper and lower surfaces of the insulating plate 3.

The insulating plate 3 is formed of an insulating material obtained by, for example, the glass cloth being impregnated with an epoxy resin or a bismaleimide triazine resin to be thermally cured. The through-hole 7 is formed by, for example, drilling, laser processing, or blast processing.

Two insulating layers 5 for the build-up are laminated on each of the upper and lower surfaces of the core board 1. Each of the insulating layers 5 has a plurality of via holes 8 penetrating from the upper surface to the lower surface thereof. The wiring conductor 6 is filled in the via hole 8. The wiring conductor 6 in the via hole 8 electrically connects the wiring conductors 6 positioned above and below the insulating layer 5 interposed therebetween or the wiring conductor 6 and the wiring conductor 4.

The insulating layer 5 for the build-up includes two particle-containing resin layers 5a including insulating particles such as silicon oxide in an insulating resin such as an epoxy resin, and a particle-free resin layer 5b interposed between the two particle-containing resin layers 5a, formed of an insulating resin such as an epoxy resin.

The insulating resin constituting the particle-containing resin layer 5a and the insulating resin constituting the particle-free resin layer 5b are not limited. In view of further improving the adhesion between the particle-containing resin layer 5a and the particle-free resin layer 5b, the insulating resin constituting the two may be the same resin. Alternatively, the insulating resin constituting the two may be different resins.

The insulating particles contained in the particle-containing resin layer 5a are used to suppress cracks occurring in the wiring conductor. The resin layer formed only of the resin has a large expansion due to heat, the wiring conductor present on the surface of such a resin layer is susceptible to the influence of expansion and contraction of the resin layer due to temperature, and cracks are likely to occur. Therefore, dispersing insulating particles in the resin layer and causing the wiring conductor to make contact with both the resin and the insulating particles makes the wiring conductor less susceptible to the influence of expansion and contraction of the resin layer due to temperature. As a result, cracks occurring in the wiring conductor are suppressed.

Furthermore, the insulating layer 5 having a structure in which a particle-free resin layer 5b is interposed between two particle-containing resin layers 5a allows the continuity of the interface between the insulating resin and the insulating particles in the particle-containing resin layers to be divided. As a result, metal ions can be effectively prevented from moving from the upper surface to the lower surface of the insulating layer 5, and the insulation reliability can be improved.

The particle-containing resin layer 5a has a thickness of about 3 to 20 μm. The insulating particles contained in the particle-containing resin layer 5a are about 60 to 72 wt %. The particle-free resin layer 5b has a thickness of about 0.1 to 10 μm. In this case, the wiring board A has a thermal expansion coefficient of about 8 to 15 ppm/° C. The particle-free resin layer 5b may have a thickness of about 0.1 to 2 μm because the thermal expansion coefficient can be suppressed to be equal to the thermal expansion coefficient of the wiring board in the absence of the particle-free resin layer 5b. In this case, the wiring board A has a thermal expansion coefficient of about 8 to 13 ppm/° C.

Laminating, for example, particle-containing sheets in a semi-cured state having a thin layer only of a resin called a skin layer on the surface with two skin layers facing each other and overlapping each other, and applying pressure while heating causes this insulating layer 5 for the build-up to be formed. Alternatively, laminating one layer of particle-containing sheet in a semi-cured state on the surface of the core board 1, on top of that, laminating a sheet in a semi-cured state formed of an insulating resin such as an epoxy resin, further on top of that, laminating one layer of particle-containing sheet in a semi-cured state, and applying pressure while heating also allows the insulating layer 5 for the build-up to be formed.

The via hole 8 is, for example, formed by laser processing. The wiring conductor 6 is deposited on the surface of the insulating layer 5, and filled in the via hole 8. A part of the wiring conductor 6 deposited on the surface of the insulating layer 5 of the outermost surface layer on the upper surface side functions as a semiconductor element connection pad 9 to be connected to the electrode T of the semiconductor element S. A part of the wiring conductor 6 deposited on the surface of the insulating layer 5 of the outermost surface layer on the lower surface side functions as an external connection pad 10 to be connected to the external circuit board. The wiring conductors 4 and 6 include good conductive metals such as copper foil and copper plating, and are formed by the well-known subtractive method, semi-additive method, and the like.

Solder interposed between the electrode T and the semiconductor-element connection pad 9 is thermally melted, and then cooled and fixed. Thus, connecting the semiconductor element S to the wiring board B and connecting the external connection pad 10 to the wiring conductor of the external circuit board causes the semiconductor element S to be electrically connected to the external circuit board.

In the wiring board A shown in FIG. 1, in the insulating layer 5 both main surfaces of which the wiring conductors 4 and 6 exist so as to be adjacent to, a particle-free resin layer 5b formed of an insulating resin is interposed between a plurality of particle-containing resin layers 5a containing insulating particles in an insulating resin. This allows the continuity of the interface between the insulating resin and the insulating particles in the particle-containing resin layers 5a to be divided by the particle-free resin layer 5b. Therefore, metal ions can be effectively prevented from moving from the upper surface to the lower surface of the insulating layer 5. As a result, the wiring board A including fine high-density wiring lines excellent in insulation reliability can be provided.

The present disclosure is not intended to be limited to the embodiment described above, and various modifications are possible as long as they do not depart from the gist of the present disclosure. In the above-described embodiment, in the insulating layer 5 for the build-up, one particle-free resin layer 5b is interposed between two particle-containing resin layers 5a. However, in the wiring board of the present disclosure, a particle-free resin layer may be interposed between each layer of three or more particle-containing resin layers.

Furthermore, in the above-described embodiment, the wiring board A includes a core board 1. However, the wiring board of the present disclosure may be a coreless board without a core board.

What is claimed is:

1. A wiring board comprising:
   an insulating layer; and
   a wiring conductor existing so as to be adjacent to both main surfaces of the insulating layer,
   wherein the insulating layer includes at least two particle-containing resin layers containing insulating particles in an resin, and a particle-free resin layer formed of an insulating resin,
   wherein the particle-free resin layer is interposed between the particle-containing resin layers, and
   wherein the particle-free resin layer has a thickness of 1 to 10 μm.

2. The wiring board according to claim 1, wherein the insulating resin constituting the particle-containing resin layer and the insulating resin constituting the particle-free resin layer have a same composition.

3. The wiring board according to claim 1, wherein the particle-containing resin layer has a thickness of 3 to 20 μm.

4. The wiring board according to claim 1, wherein the particle-containing resin layer has a thickness of 0.1 to 2 μm.

* * * * *